United States Patent
Chang et al.

(10) Patent No.: US 8,551,193 B2
(45) Date of Patent: Oct. 8, 2013

(54) NICKEL ALLOY TARGET INCLUDING A SECONDARY METAL

(75) Inventors: Shih-Chieh Chang, Taipei (TW); Ying-Lang Wang, Tai-Chung (TW); Kei-Wei Chen, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 180 days.

(21) Appl. No.: 13/188,182

(22) Filed: Jul. 21, 2011

(65) Prior Publication Data

US 2013/0020617 A1   Jan. 24, 2013

(51) Int. Cl.
   *C22C 19/03*   (2006.01)
   *H01L 21/283*  (2006.01)

(52) U.S. Cl.
   USPC ...... 29/25.01; 420/441; 420/456; 204/298.13

(58) Field of Classification Search
   USPC ............... 420/441, 456; 204/192.17, 298.13; 29/25.01
   See application file for complete search history.

(56) References Cited

U.S. PATENT DOCUMENTS

| | | | |
|---|---|---|---|
| 8,114,341 B2 * | 2/2012 | Yamakoshi | 420/456 |
| 2007/0051623 A1 * | 3/2007 | Hansen et al. | 204/298.12 |
| 2012/0098131 A1 * | 4/2012 | Yamakoshi | 257/741 |
| 2013/0032477 A1 * | 2/2013 | Yamakoshi et al. | 204/298.13 |

FOREIGN PATENT DOCUMENTS

JP   2009167530 A  *  7/2009

* cited by examiner

*Primary Examiner* — George Fourson, III
(74) *Attorney, Agent, or Firm* — Slater & Matsil, L.L.P.

(57) ABSTRACT

A target includes nickel and a secondary metal. The secondary metal has a volume percentage between about 1 percent and about 10 percent. The secondary metal has a density between about 5,000 kg/m$^3$ and about 15,000 kg/m$^3$.

7 Claims, 3 Drawing Sheets

NICKEL ALLOY TARGET INCLUDING A SECONDARY METAL

BACKGROUND

Complementary metal-oxide-semiconductor (CMOS) devices comprise source regions, drain regions, and gate electrodes, which are often formed of silicon-containing materials. To reduce the contact resistance between the silicon-containing source/drain regions and the silicon-containing gate electrodes, metal silicides may be formed atop the source/drain regions and the gate electrodes prior to the formation of various metal layers comprising conductive interconnect lines and vias. The most commonly used metal silicides are nickel silicide and cobalt silicide, typically formed by a self-aligned silicide (salicide) process.

In a salicide process, a thin layer of metal is blanket deposited by physical vapor deposition (PVD) over a semiconductor wafer, specifically over exposed source/drain regions and gate electrodes. The wafer is then subjected to one or more annealing steps, for example, at a temperature of 250° C. or higher. The annealing process causes the metal to selectively react with the exposed silicon of the source/drain regions and the gate electrodes, thereby forming metal silicide regions. The process is referred to as a self-aligned silicidation process because the silicide layer is formed where the metal material directly contacts the silicon source/drain regions and the gate electrode. Following the formation of the silicide regions, the un-reacted metal is removed. An interconnect process is then performed to provide conductive paths, such as by forming via holes through a deposited interlayer dielectric and filling the via holes with a conductive material, e.g., tungsten or copper.

For sub-65 nm technologies, nickel is widely used to form silicides. A problem of the nickel silicide is its poor thermal stability, and the tendency of forming agglomeration. The resistivity of the resulting silicide is increased as a result of the agglomeration. To improve the thermal stability of nickel silicides, platinum may be added to the nickel silicide. To add platinum, the target that is used in the PVD is added with platinum, which may have a percentage between about 5 percent and about 10 percent. The improvement in the thermal stability of the silicides as a result of adding platinum, however, is still not satisfactory, and the thermal stability of the silicides needs to be improved further.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A target for a physical vapor deposition (PVD) process and the silicides formed using the target are provided in accordance with an embodiment. The variations of the embodiment are then discussed. Throughout the various views and illustrative embodiments, like reference numbers are used to designate like elements.

Figure 1:
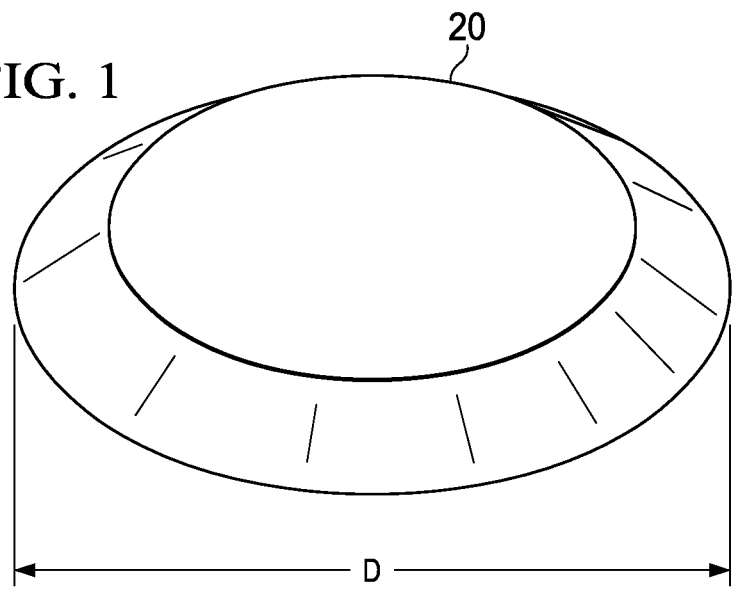
FIG. 1 illustrates a perspective view of a target in accordance with an embodiment, which may be using in a physical vapor deposition (PVD) tool.

FIG. 1 illustrates a schematic perspective view of target 20, which may be used for PVD processes. In an embodiment, target 20 has a circular top-view shape (or any other applicable shape such as square and rectangle), and may have diameter D between about 15 inches and about 20 inches. It is realized, however, that the dimensions recited throughout the description are merely examples, and may be changed.

Target 20 may include nickel, with the volume percentage of nickel in target 20 being greater than about 90 percent. The volume percentage of nickel may also be between about 90 percent and about 99 percent. In addition, target 20 includes an additional metal(s) (referred to as a secondary metal hereinafter). The secondary metal may have densities ranging from about 5,000 kg/m$^3$ to 15,000 kg/m$^3$. In addition, the secondary metal may have a diffusivity that is higher than the diffusivity of nickel, wherein the diffusivity is measured as the diffusivity of the secondary metal in silicon. With a high diffusivity, and hence smaller chance to form agglomeration, the secondary metal has good thermal stability during silicide processes, in which the metal layers formed using target 20 react with silicon to form silicide regions.

In some embodiments, the secondary metal includes a metal selected from the group consisting essentially of zinc, molybdenum, ruthenium, and combinations thereof. Target 20 may thus be an alloy of nickel and one or more of zinc, molybdenum, and ruthenium. The density of nickel is 8,800 kg/m$^3$. The density of zinc is 7,135 kg/m$^3$. The density of molybdenum is 10,188 kg/m$^3$. The density of ruthenium is 12,370 kg/m$^3$. The secondary metal in target 20 may have a volume percentage between about 1 percent and about 10 percent. In the case a single one (but not all) of zinc, molybdenum, and ruthenium is included in target 20, the single secondary metal has a volume percentage between about 1 percent and about 10 percent, or between about 4 percent and about 6 percent. In the embodiments wherein more than one of zinc, molybdenum, and ruthenium is used in target 20, the secondary metals have a total volume percentage between about 1 percent and about 10 percent, or between about 4 percent and about 6 percent.

Figure 2:
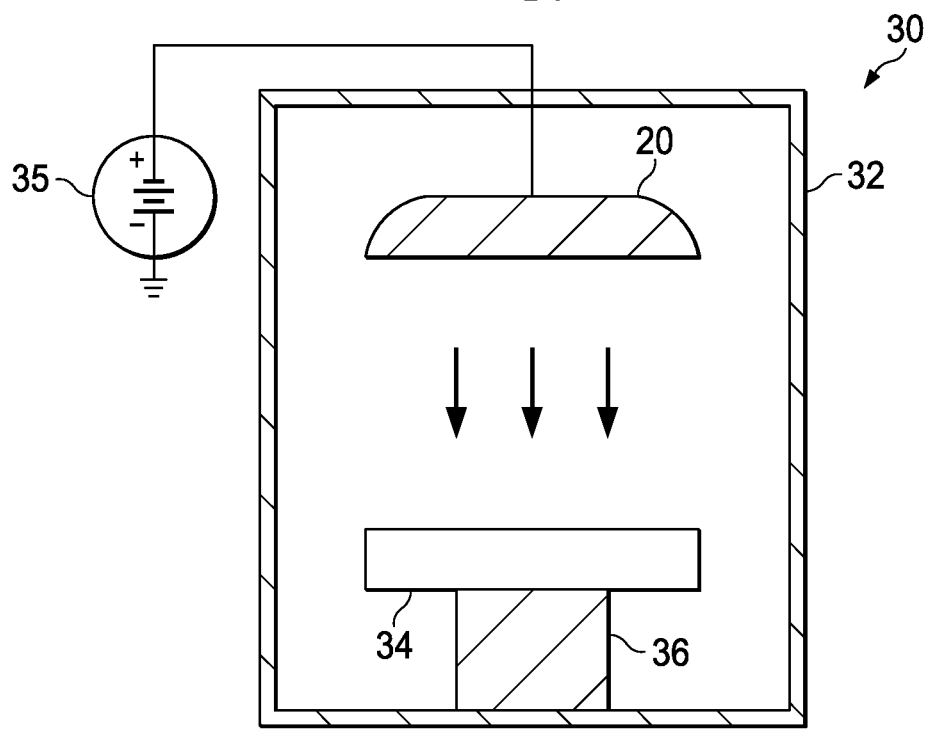
FIG. 2 schematically illustrates the PVD tool and the target installed therein.

FIG. 2 illustrates a schematic cross-sectional view of production tool 30, which may be a PVD tool, although production tool 30 may also be used for other deposition methods. Production tool 30 includes chamber 32 that is capable of being vacuumed, so that a vacuum environment is generated in chamber 32. Target 20 is installed in chamber 32. Wafer 34 is placed on pedestal 36, which may be an electrostatic chuck (E-Chuck) configured to hold wafer 34 in place. Wafer 34 may be a semiconductor wafer for forming integrated circuits. In the PVD process, the metal atoms in target 20 may be sputtered off, and deposited on the surface of wafer 34. The energy source for sputtering target 20 may be a DC voltage source 35, although a radio frequency (RF) energy source may also be used.

Figure 3:
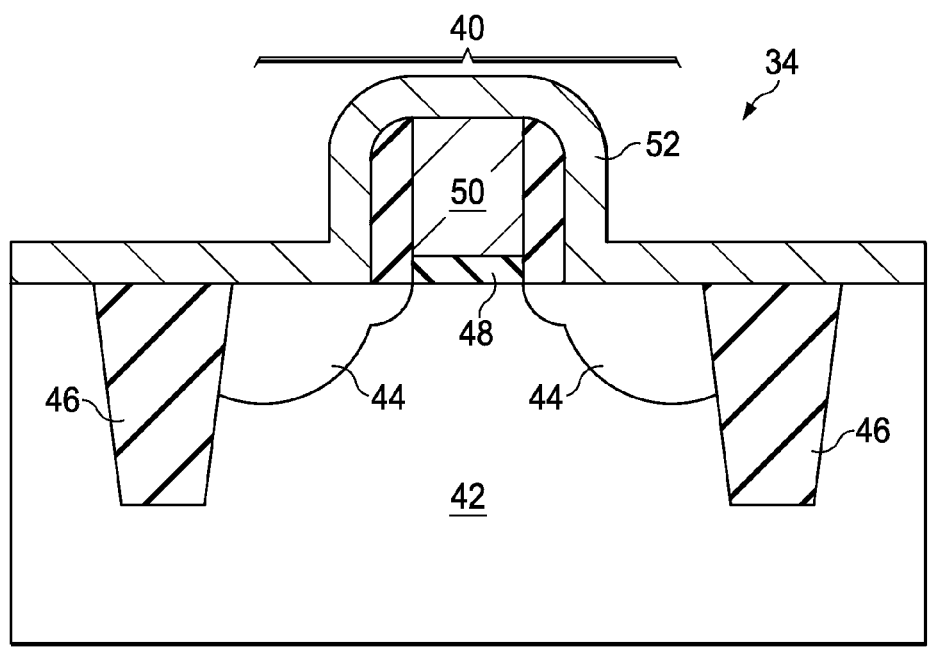
FIGS. 3 an 4 are cross-sectional views of intermediate stages in the manufacturing of silicide regions of a metal-oxide-semiconductor (MOS) device in accordance with an embodiment.
Figure 4:
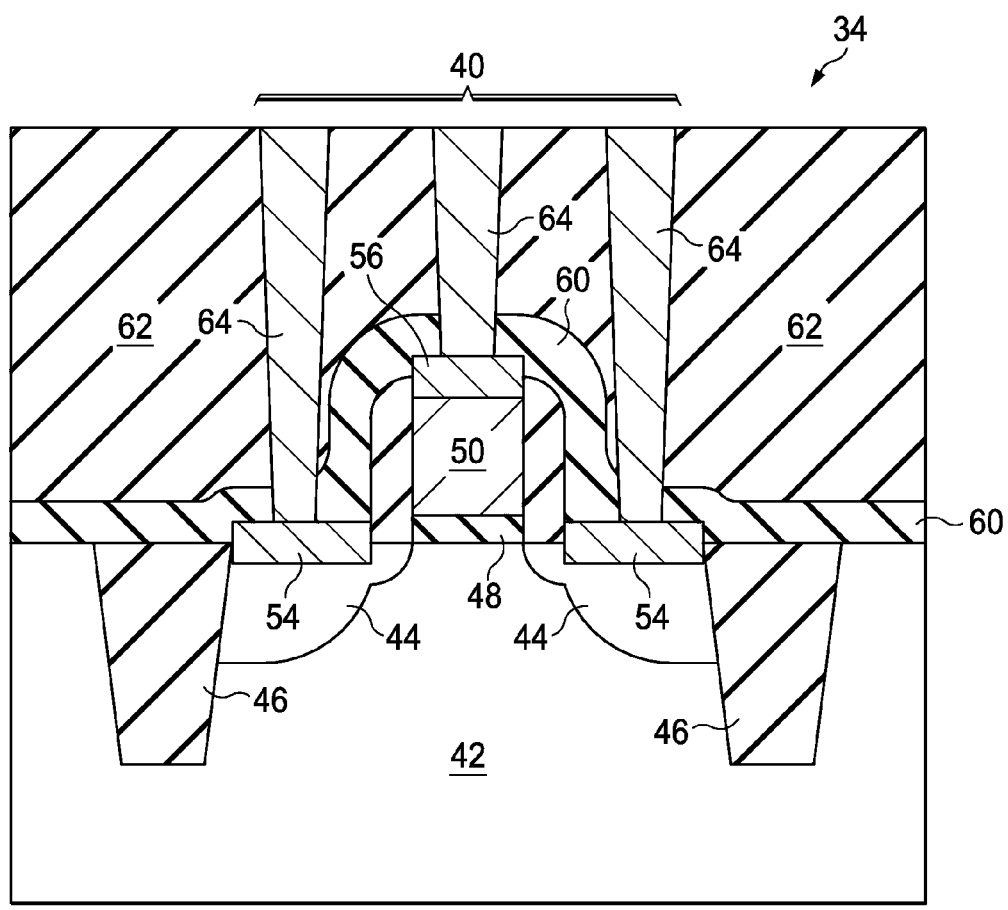

FIGS. 3 and 4 are cross-sectional views of intermediate stages in a silicidation process performed on wafer 34 as shown in FIG. 2. Referring to FIG. 3, wafer 34 comprises metal-oxide-semiconductor (MOS) device 40, which may be formed on silicon-containing substrate 42. Silicon-containing substrate 42 may be a bulk silicon substrate, or may have a silicon-on-insulator structure. Source and drain regions 44 (referred to as source/drain regions hereinafter) are formed, and may comprise silicon. Source and drain regions 44 may, or may not, comprise nickel and/or the secondary metal. MOS device 40 may be adjacent to isolation regions 46, which may be shallow trench isolation (STI) regions. A gate stack comprising gate dielectric 48 and gate electrode 50 is formed over substrate 42. Gate electrode 50 may be a metal gate or a polysilicon gate.

Using production tool 30 as in FIG. 2, metal layer 52 (FIG. 3) may be deposited on MOS device 40, wherein metal layer 52 is in contact with source and drain regions 44. The materials of metal layer 52 are sputtered off from target 20 (FIG. 2), and hence metal layer 52 includes nickel and the secondary metal. In addition, metal layer 52 may have a composition (the percentages of nickel and the secondary metal) close to the composition of target 20, although the compositions of nickel and the secondary metal may be slightly different from that of target 20.

Referring to FIG. 4, an annealing is performed, forming source/drain silicide regions 54 over and contacting source/drain regions 44. In the embodiments wherein gate electrode 50 is a polysilicon gate, gate silicide 56 is also formed. The annealing may be performed at a temperature over about 400° C., although a lower temperature may be used, providing the quality of the resulting silicide regions is not compromised. The annealing process may be performed using thermal annealing, flash annealing, laser annealing, and the like. In an exemplary embodiment, the annealing process comprises two steps. The first step includes a first annealing at a relatively low temperature. In the first step, a portion of metal layer 52 (FIG. 3) reacts with silicon to form a silicide. This silicide typically has a higher resistivity than in the structure as shown in FIG. 4. Un-reacted metal layer 52 is then removed. The second step includes a second annealing to convert the high-resistive silicide to a low-resistive silicide. In an exemplary embodiment, the first annealing is performed at about 300° C. to about 400° C., while the second annealing is performed at about 700° C.

It is observed that in the silicidation process, although silicon is added into nickel and the secondary metal, the addition of silicon does not affect the relative ratio of nickel to the secondary metal. Alternatively stating, in silicide regions 54 and 56, the volume percentage of nickel among nickel and the secondary metal remains the same as the volume percentage of nickel in metal layer 52. The volume percentage of nickel among nickel and the secondary metal may be expressed as:

$$PNi=(VNi/(VNi+VSM))*100\%$$ (Eq. 1)

Wherein PNi is the volume percentage of nickel among nickel and the secondary metal, VNi is the total volume of nickel in the respective silicide regions 54 and 56, and VSM is the total volume of the secondary metal.

Similarly, in silicide regions 54 and 56, the volume percentage of the secondary metal among nickel and the secondary metal remains the same as the volume percentage of the secondary metal in metal layer 52. The volume percentage of the secondary metal among nickel and the secondary metal may be expressed as:

$$PSM=(VSM/(VNi+VSM))*100\%$$ (Eq. 1)

wherein PSM is the volume percentage of the secondary metal among nickel and the secondary metal. Accordingly, in silicide regions 54 and 56, the volume percentage of nickel among nickel and the secondary metal may be between about 90 percent and about 99 percent, while the volume percentage of the secondary metal among nickel and the secondary metal may be between about 1 percent and about 10 percent.

The composition of silicide regions 54 and 56 may also be expressed as $Si_xNi_yM_z$, wherein letter "M" represents the secondary metal, and letters "x," "y," and "z" represent the volume percentages of silicon, nickel, and the secondary metal, respectively. In an embodiment, ratio z/x is between about 0.005 and about 0.1.

After the formation of silicide regions 54 and 56, the remaining components of MOS device 40 are formed. The formation process includes forming contact etch stop layer (CESL) 60 over silicide regions 54 and 56, forming inter-layer dielectric (ILD) 62 over CESL 60, forming contact openings (occupied by contact plugs 64) in ILD 62 and CESL 60, and filling the contact openings with a metallic material such as tungsten to form contact plugs 64.

Figure 5:
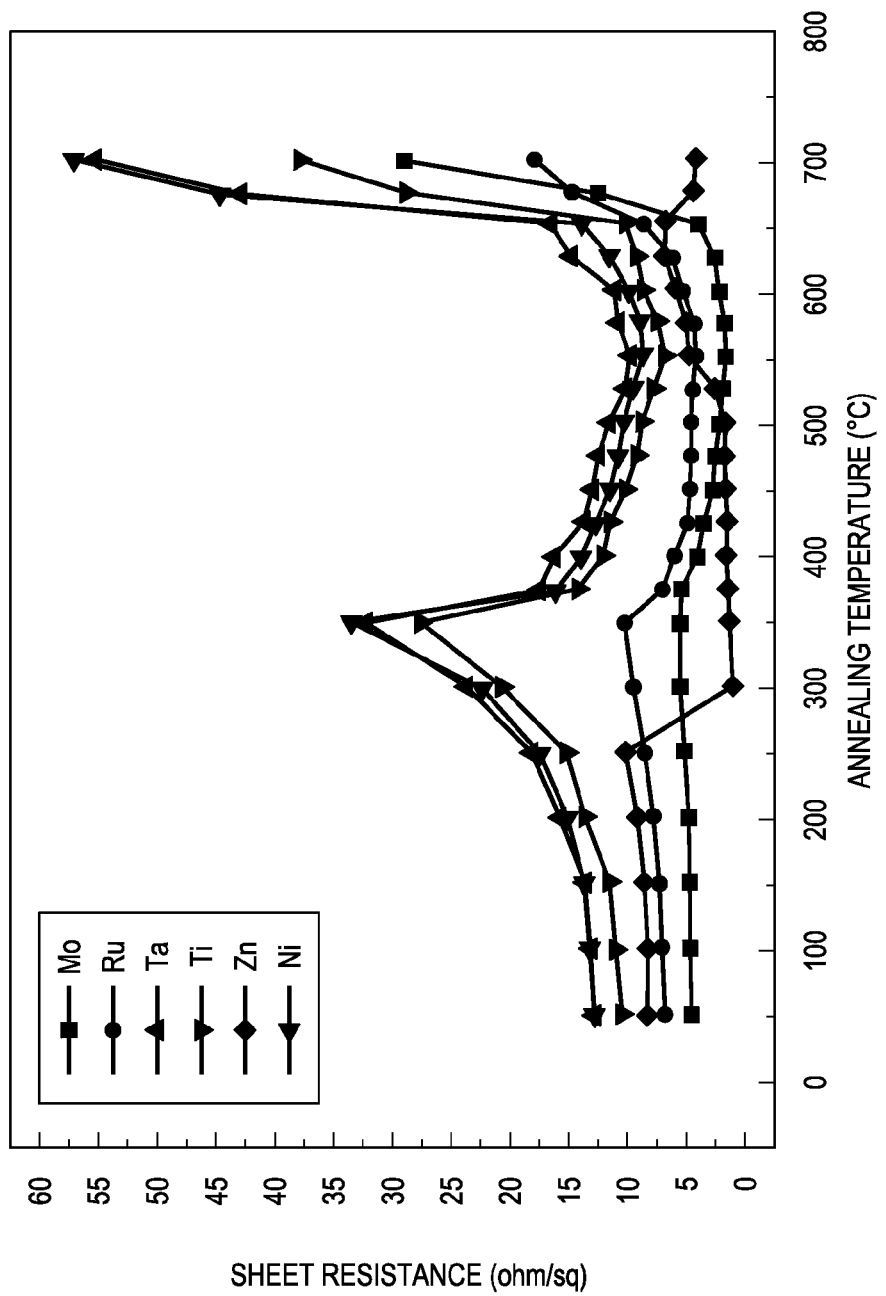
FIG. 5 illustrates experiment results, wherein the sheet resistances of different alloys are illustrated as a function of annealing temperatures.

In the embodiments, due to the addition of the secondary metal, the resulting silicide regions 54 and 56 may have a significantly improved thermal stability at temperatures higher than about 600° C. FIG. 5 illustrates experimental results, wherein the sheet resistances of various sample silicide regions are illustrated. The samples are formed on silicon wafers. The experimental results indicate that when the annealing temperatures are higher than 600° C., the silicide regions formed using nickel and the secondary metal (comprising zinc, molybdenum, or ruthenium) have sheet resistances significantly lower than the silicide region formed by adding other metals such as tantalum, titanium. Especially, when zinc is added into nickel, the resulting nickel-and-zinc-containing silicides, when annealed at 700° C., have a sheet resistance substantially equal to or smaller than the sheet resistances of all other silicides that are formed under different temperatures ranging from 50° C. to 700° C. This indicates that at 700° C., no agglomeration is formed in the silicides comprising nickel and zinc. Furthermore, under scanning electron microscope (SEM), the silicide regions formed with zinc, molybdenum, or ruthenium added (to 5 percent) also show that substantially no agglomeration is formed.

In accordance with embodiments, a target includes nickel and a secondary metal. The secondary metal has a volume percentage between about 1 percent and about 10 percent. The secondary metal has a density between about 5,000 kg/m³ and about 15,000 kg/m³.

In accordance with other embodiments, a device includes a substrate and a MOS device. The MOS device includes a gate dielectric over the substrate, a gate electrode over the gate dielectric, a source/drain region adjacent the gate dielectric, and a source/drain silicide over and contacting the source/drain region. The source/drain silicide includes nickel and a secondary metal, wherein the secondary metal has a density between about 5,000 kg/m³ and about 15,000 kg/m³.

In accordance with yet other embodiments, a PVD tool includes a chamber capable of being vacuumed. A target is installed in the chamber. The target includes nickel and a secondary metal selected from the group consisting essentially of zinc, molybdenum, ruthenium, and combinations thereof. The PVD tool further includes a pedestal configured to hold a semiconductor wafer thereon In accordance with yet other embodiments, a method includes forming a MOS device, wherein the step of forming the MOS device includes forming a gate dielectric over a substrate; forming a gate electrode over the gate dielectric; and forming a source/drain region adjacent the gate dielectric.

The method further includes, in a production tool, depositing a metal layer over the MOS device, wherein the metal layer contacts the source/drain region. A target in the production tool and used in the step of depositing includes nickel and a secondary metal, which is selected from the group consisting essentially of zinc, molybdenum, ruthenium, and combinations thereof. An annealing is then performed to react the metal layer with the source/drain region to form a source/drain silicide region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A target comprising:
   nickel and a secondary metal, wherein the secondary metal has a volume percentage between about 1 percent and about 10 percent, and wherein the secondary metal has a density between about 5,000 kg/m$^3$ and about 15,000 kg/m$^3$.

2. The target of claim 1, wherein the secondary metal is selected from the group consisting essentially of zinc, molybdenum, ruthenium, and combinations thereof.

3. The target of claim 2, wherein the secondary metal comprises zinc.

4. The target of claim 2, wherein the secondary metal comprises molybdenum.

5. The target of claim 2, wherein the secondary metal comprises ruthenium.

6. The target of claim 1, where the nickel in the target has a volume percentage greater than about 90 percent.

7. The target of claim 1 being configured to be used in a physical vapor deposition (PVD) tool, wherein the PVD tool comprises:
   a chamber capable of being vacuumed, wherein the target is capable of being installed in the chamber; and
   a pedestal configured to hold a semiconductor wafer thereon.

* * * * *